(12) United States Patent
Ohnishi et al.

(10) Patent No.: US 8,291,558 B2
(45) Date of Patent: Oct. 23, 2012

(54) PIEZOELECTRIC/ELECTROSTRICTION ELEMENT MANUFACTURING METHOD

(75) Inventors: Takao Ohnishi, Nagoya (JP); Takashi Wada, Nagoya (JP); Tomohiro Yamada, Nagoya (JP); Makoto Tani, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 899 days.

(21) Appl. No.: 11/962,863

(22) Filed: Dec. 21, 2007

(65) Prior Publication Data

US 2008/0098582 A1    May 1, 2008

Related U.S. Application Data (63) Continuation of application No. PCT/JP2006/312971, filed on Jun. 29, 2006.

(30) Foreign Application Priority Data

Jun. 29, 2005   (JP) .................................. 2005-189326
Nov. 15, 2005   (JP) .................................. 2005-330589

(51) Int. Cl.
*H04R 17/10*   (2006.01)
*C04B 35/64*   (2006.01)

(52) U.S. Cl. ............. 29/25.35; 29/851; 29/846; 432/18; 252/62.9 PZ (58) Field of Classification Search .................. 29/25.35, 29/593, 851; 252/62.9 R, 62.9 PZ; 432/18
See application file for complete search history.

(56) References Cited

U.S. PATENT DOCUMENTS

| | | | |
|---|---|---|---|
| 4,692,285 A | | 9/1987 | Bloomfield et al. |
| 5,505,870 A | * | 4/1996 | Yoo et al. ............... 252/62.9 PZ |
| 5,766,502 A | * | 6/1998 | Hase et al. ............. 252/62.9 PZ |
| 5,889,351 A | | 3/1999 | Okumura et al. |
| 6,263,552 B1 | * | 7/2001 | Takeuchi et al. ............. 29/25.35 |
| 6,541,895 B2 | | 4/2003 | Yamaguchi |
| 6,628,042 B2 | | 9/2003 | Tomohiro |
| 2003/0062912 A1 | | 4/2003 | Nakajima |

FOREIGN PATENT DOCUMENTS

| | | | |
|---|---|---|---|
| EP | 1 237 204 A2 | | 9/2002 |
| JP | 06-244473 | | 9/1994 |
| JP | 08-201265 | | 8/1996 |
| JP | 10190387 A | * | 7/1998 |
| JP | 2002-176209 | | 6/2002 |
| JP | 2004-23688 | | 1/2004 |
| JP | 2004-296784 | | 10/2004 |
| JP | 2005-228865 | | 8/2005 |

\* cited by examiner

*Primary Examiner* — A. Dexter Tugband
(74) *Attorney, Agent, or Firm* — Burr & Brown (57) ABSTRACT

A method for manufacturing a piezoelectric/electrostrictive element includes a step of subjecting the piezoelectric/electrostrictive film to a heat treatment and a polarization treatment after the film is allowed to stand until the value of an electric constant has converged after the heat treatment. The piezoelectric/electrostrictive element manufactured in this method has small stress remaining in the piezoelectric/electrostrictive film, and predetermined performance regarding, for example, a displacement amount, a displacement-generating force, and an electric power efficiency (consumed electric power) as a piezoelectric/electrostrictive element (piezoelectric/electrostrictive film) is never spoiled.

5 Claims, 3 Drawing Sheets

PIEZOELECTRIC/ELECTROSTRICTION ELEMENT MANUFACTURING METHOD

TECHNICAL FIELD

The present invention relates to a method for manufacturing a piezoelectric/electrostrictive element.

BACKGROUND ART

Piezoelectric/electrostrictive devices, which are also called film type elements, have conventionally been used as actuators or various kinds of sensors. A piezoelectric/electrostrictive device used as a sensor is used for measuring characteristics such as density, concentration, and viscosity of fluid as disclosed in the Patent Document 1. Such a piezoelectric/electrostrictive device is used as a sensor by utilizing a correlation between an amplitude of a transducer being provided in the device and a viscous resistance of fluid in contact with the transducer. Since a vibration mode in a mechanical system such as vibrations of a transducer can be converted into an equivalent circuit in an electric system, when the piezoelectric/electrostrictive device is caused to be vibrated in fluid so that the transducer receives a mechanical resistance based on a viscous resistance of fluid, a change in an electric constant of an equivalent circuit of a piezoelectric body constituting the transducer is detected, which enables measurement of characteristics such as viscosity, density, and concentration of the fluid.

Fluids which can be measured by the piezoelectric/electrostrictive device as a sensor are liquid and gas. The liquid includes not only liquid having only one component such as water, alcohol, oil, or the like, but also liquid, slurry, and paste prepared by dissolving, mixing, or suspending a soluble or insoluble solute in the above liquid. Examples of the electric constant to be detected include a loss coefficient, phase, resistance, reactance, conductance, susceptance, inductance, electrostatic capacity (capacitance) and the like. In particular, a loss coefficient or a phase each having the minimum or maximum changing point at around a resonance frequency of the equivalent circuit is preferably employed. This enables measurement of not only viscosity but also density and concentration of fluid. For example, sulfuric acid concentration in a sulfuric acid aqueous solution can be measured. Incidentally, a change in the resonance frequency can be used as an index for detecting a change of a vibration mode besides an electric constant as long as no problem is caused in view of measurement accuracy and durability.

A piezoelectric/electrostrictive material is used for a piezoelectric/electrostrictive element, which corresponds to a portion where displacement is (vibrations are) caused in the piezoelectric/electrostrictive device. The piezoelectric/electrostrictive material generally has a ferroelectric phase at ordinary temperature and a paraelectric phase or an antiferroelectric phase at high temperature. For example, a piezoelectric/electrostrictive material containing $Pb(Zr_{0.54}Ti_{0.46})O_3$ (lead zirconate titanate) as the main component has a ferroelectric phase from ordinary temperature to around 320° C. and a paraelectric phase at around 320° C. or higher. In addition, for example, a piezoelectric/electrostrictive material containing $(Bi_{0.5}Na_{0.5})TiO_3$ (bismuth sodium titanate) as the main component has a ferroelectric phase from ordinary temperature to around 200° C., and an antiferroelectric phase from around 200° C. to around 320° C., and a paraelectric phase at around 320° C. or higher.

In the case of using such a piezoelectric/electrostrictive material for a piezoelectric/electrostrictive element, generally, after a piezoelectric/electrostrictive material, an electrode material, and the like are formed into desired shapes, followed by a heat treatment for integration, a polarization treatment is performed at temperature lower than the phase transformation temperature, where a ferroelectric phase at around ordinary temperature becomes the main phase, to obtain desired piezoelectric/electrostrictive characteristics. On this occasion, an electric constant, for example, a value of the electrostatic capacity of the piezoelectric/electrostrictive element after the polarization treatment is different from that before the polarization treatment. This is because crystal axes of the piezoelectric/electrostrictive material are oriented by the polarization treatment. Generally, a change ratio of the electric constant of the piezoelectric/electrostrictive element after the polarization to that before the polarization shows an almost constant value in each piezoelectric/electrostrictive material. In addition, a piezoelectric/electrostrictive element subjected to the polarization treatment can be restored in a state before the polarization treatment is conducted by a regeneration treatment where the piezoelectric/electrostrictive element is heated at the phase transformation temperature or higher. After the regeneration treatment, the electric constant of the piezoelectric/electrostrictive element returns to the value before the polarization treatment. When the polarization treatment is performed again, the electric constant becomes almost the same as that after the first polarization treatment. Thus, by the polarization treatment and the regeneration treatment, the electric constant of the piezoelectric/electrostrictive element can reversibly be changed.

Patent Document 1: JP-A-8-201265
Patent Document 2: JP-A-2004-23688

DISCLOSURE OF THE INVENTION

It is desirable that a piezoelectric/electrostrictive element provided on a piezoelectric/electrostrictive device to be used as the aforementioned sensor has characteristics which do not fluctuate, while initial characteristics of conventional piezoelectric/electrostrictive elements sometimes fluctuate element by element. To cope with this problem, a method for manufacturing piezoelectric parts, the method having a step of allowing the piezoelectric/electrostrictive element to stand at ordinary temperature after thermal aging in the stage of finished goods is proposed in the Patent Document 2. Though the polarization treatment is important to make characteristics of the piezoelectric/electrostrictive element stable, the polarization becomes unstable due to the thermal aging. Therefore, a piezoelectric/electrostrictive element having stable characteristics cannot always be attained by the method disclosed therein.

The present invention has been made in view of such circumstances and aims to provide a means for obtaining a piezoelectric/electrostrictive element having stable initial characteristics.

The present inventors have studied repeatedly and found that, in the case that the piezoelectric/electrostrictive element is subjected to a heat treatment at phase transformation temperature or higher, the phase does not return to a ferroelectric phase immediately even if temperature of the piezoelectric/electrostrictive element is returned to ordinary temperature after the heat treatment, and the phase shows a behavior of gradually returning to the ferroelectric phase for several minutes to several hours. That is, even after the temperature of the piezoelectric/electrostrictive element is returned to ordinary temperature, the inside of the piezoelectric/electrostrictive element is in the state where the ferroelectric phase and the paraelectric phase or the antiferroelectric phase microscopically coexist, and percentages of them gradually change with lapse of time after the heat treatment to finally form a microstructure having the ferroelectric phase as the main phase. Though the mechanism for this behavior is not certain, it is presumed that stress generated inside the piezoelectric/electrostrictive element in accordance with heating is gradually released with lapse of time.

Such a change in the phase structure with lapse of time after the heat treatment influences an electric constant, for example, an electrostatic capacity of the piezoelectric/electrostrictive element. The electric constant of the piezoelectric/electrostrictive element changes immediately right after the heat treatment, and then the change is reduced gradually, and the electric constant approaches a constant value. Therefore, a completion state of the phase transformation can be grasped from the change in the electric constant.

Further, the inventors of the present invention found out that, when the polarization treatment is performed in the state that the phase transformation to the ferroelectric phase is insufficient after the heat treatment as described above, sufficient piezoelectric/electrostrictive characteristics cannot be obtained to cause fluctuation in characteristics. That is, in the case that the piezoelectric/electrostrictive element is subjected to a polarization treatment in the state that the phase transformation after the heat treatment is insufficient, a change in the electric constant of the piezoelectric/electrostrictive element by the polarization treatment is different from the case that the polarization treatment is performed in a state that the phase transformation is sufficiently caused. In particular, depending on the piezoelectric/electrostrictive material, a size relation of the electric constants before and after the polarization treatment may become reverse by the polarization treatment in the state of insufficient phase transformation with respect to the case of the polarization treatment in the state of sufficient phase transformation. In such a case, piezoelectric/electrostrictive characteristics after the polarization treatment are very low, and characteristics vary to a great extent depending on the timing of performing the polarization treatment.

In a process for manufacturing a piezoelectric/electrostrictive element, a heat treatment is sometimes performed in a step of removing an unnecessary organic substance, a step of removing water, or the like, besides a step of unitarily joining a piezoelectric/electrostrictive material with an electrode material. The time spent from these heat treatment steps to the polarization treatment steps influences piezoelectric/electrostrictive characteristics after the polarization treatment.

Under the above findings, the present invention shown below has been completed as a means capable of stabilizing characteristics of a piezoelectric/electrostrictive element.

That is, in the first place, there is provided a method for manufacturing a piezoelectric/electrostrictive element comprising a lower electrode, a piezoelectric/electrostrictive film, and an upper electrode stacked in this order, wherein the method has a step of subjecting the piezoelectric/electrostrictive film to a heat treatment and a polarization treatment after the film is allowed to stand until the value of an electric constant has converged after the heat treatment. Here, to converge means that the size relation between an electric constant (e.g., electrostatic capacity) before polarization and that after polarization coincides with a size relation in the case that the polarization treatment is performed after the piezoelectric film is allowed to stand for a sufficient time after the heat treatment. In other words, a size relation between an electric constant (e.g., electrostatic capacity) before polarization and that after polarization, which does not coincide with a size relation in the case that the polarization treatment is performed after the piezoelectric film is allowed to stand for a sufficient time after the heat treatment in the initial stage, coincides with a size relation in the case that the polarization treatment is performed after the piezoelectric film is allowed to stand for a sufficient time after the heat treatment in the course of time, and the electric constant is judged to have converged when a size relation between an electric constant (e.g., electrostatic capacity) before polarization and that after polarization coincides with a size relation in the case that the polarization treatment is performed after the piezoelectric film is allowed to stand for a sufficient time after the heat treatment.

When the piezoelectric/electrostrictive film formed of a piezoelectric/electrostrictive material a heat treatment at a phase transformation temperature or higher, the piezoelectric/electrostrictive film causes phase transformation to change the crystal structure. Then, by reducing the temperature and allowing to stand the piezoelectric/electrostrictive film, the internal stress is released, and the phase of the piezoelectric/electrostrictive film seems to be transformed into a predetermined phase. When the polarization treatment is conducted before such a transformation into a predetermined phase, large internal stress is generated in the piezoelectric/electrostrictive film, and thereby predetermined characteristics (e.g., piezoelectric constant), which the piezoelectric/electrostrictive film has, may not be obtained. This can be a cause of fluctuation in the initial stage. It can be assumed that, as a result, characteristics of a piezoelectric/electrostrictive element and a piezoelectric/electrostrictive device both having such a piezoelectric/electrostrictive film are fluctuated. Here, a predetermined phase refers to a state in which a ferroelectric phase and a paraelectric phase or an antiferroelectric phase microscopically coexist at a predetermined ratio suitable for the piezoelectric/electrostrictive film. In a method for manufacturing a piezoelectric/electrostrictive element of the present invention, the convergence of the electric constant of the piezoelectric/electrostrictive film after the heat treatment is regarded as the completion of the phase transition of the piezoelectric/electrostrictive film after the heat treatment, and the piezoelectric/electrostrictive film is subjected to the polarization treatment after the completion. Therefore, a piezoelectric/electrostrictive film to be subjected to a polarization treatment is in the state of a predetermined phase, and characteristics can surely be retained within a value of certain ranges without fluctuating even if the polarization treatment is performed. Therefore, even in a piezoelectric/electrostrictive element and a piezoelectric/electrostrictive device, fluctuation in characteristics in the initial stage is hardly caused. Characteristics of the piezoelectric/electrostrictive device means, for example, an electric charge generated in the case that vibrations are applied under the same conditions, in the case of a sensor, and an amount of displacement, a displacement-generating force and electric power efficiency (consumed electric power), in the case of an actuator.

In a method for manufacturing a piezoelectric/electrostrictive element of the present invention, temperature when the film is allowed to stand is preferably the same as phase transformation temperature of the piezoelectric/electrostrictive film or lower. Because, according to this preferable mode, transition of a piezoelectric/electrostrictive film into a predetermined phase is accelerated, and the time from the heat treatment to the polarization treatment can be reduced.

In a method for manufacturing a piezoelectric/electrostrictive element of the present invention, it is preferable that the polarization treatment is conducted by applying pulsing voltage to the piezoelectric/electrostrictive film at least once.

Because, according to this preferable mode, characteristics of a piezoelectric/electrostrictive device can further be stabilized.

In a method for manufacturing a piezoelectric/electrostrictive element of the present invention, the electric constant is preferably an electrostatic capacity or a loss coefficient. Further, as the electric constant, there can suitably be used resistance, reactance, conductance, susceptance, inductance, or the like.

Incidentally, in the case of manufacturing a piezoelectric/electrostrictive element, a method where a plurality of piezoelectric/electrostrictive elements stacked up are manufactured at once and then divided into each of the plurality of piezoelectric/electrostrictive elements in order to enhance the production efficiency. In this case, the internal stress is present in the piezoelectric/electrostrictive elements stacked up before they are divided. If polarization is performed in this state, the predetermined performances, for example, a displacement amount and a displacement-generating force of the piezoelectric/electrostrictive film are spoiled. Therefore, it is desirable to perform polarization after the internal stress is released by dividing the piezoelectric/electrostrictive elements using a dicer or the like.

Next, there is provided a method for manufacturing a piezoelectric/electrostrictive device having a piezoelectric/electrostrictive element comprising a lower electrode, a piezoelectric/electrostrictive film, and an upper electrode stacked in this order, wherein the method includes a step of forming a piezoelectric/electrostrictive element on the ceramic substrate according to any one of the aforementioned methods of the present invention after the ceramic substrate is obtained.

Next, there is provided a piezoelectric/electrostrictive element comprising a lower electrode, a piezoelectric/electrostrictive film, and an upper electrode stacked in this order, wherein the piezoelectric/electrostrictive element is manufactured by any one of the aforementioned methods for manufacturing a piezoelectric/electrostrictive element. That is, the piezoelectric/electrostrictive element of the present invention is specified by two essential factors. One is that the piezoelectric/electrostrictive film is subjected to polarization (polarized) as an object. The other is that the piezoelectric/electrostrictive film is subjected to a polarization treatment after the piezoelectric/electrostrictive film is subjected to a heat treatment and allowed to stand until convergence of an electric constant after the heat treatment on the piezoelectric/electrostrictive film is completed (that the object is manufactured in such a manner). In a piezoelectric/electrostrictive element subjected to a polarization treatment according to the second essential factor, as a result, the size relation between the electrostatic capacity of the piezoelectric/electrostrictive film and that before the polarization treatment is performed or after a regeneration treatment is the same as the size relation between the electrostatic capacity after the polarization and that before polarization in the case that the polarization treatment is performed after the piezoelectric/electrostrictive film is sufficiently allowed to stand after the regeneration treatment.

Next, there is provided a piezoelectric/electrostrictive device having the aforementioned piezoelectric/electrostrictive element on a ceramic substrate having a thin diaphragm portion having a thick portion in a peripheral brim portion.

DESCRIPTION OF REFERENCE NUMERALS

1: ceramic substrate, 2: thick portion, 3: thin diaphragm portion, 4: lower electrode, 5: piezoelectric/electrostrictive film, 6: upper electrode, 7A, 7B: incompletely bonded portion, 7C: bonding layer, 8: auxiliary electrode, 9: through-hole, 10: hollow portion, 11: protruding portion, 15: piezoelectric/electrostrictive body, 20: connection electrode

BEST MODE FOR CARRYING OUT THE INVENTION

Figure 1:
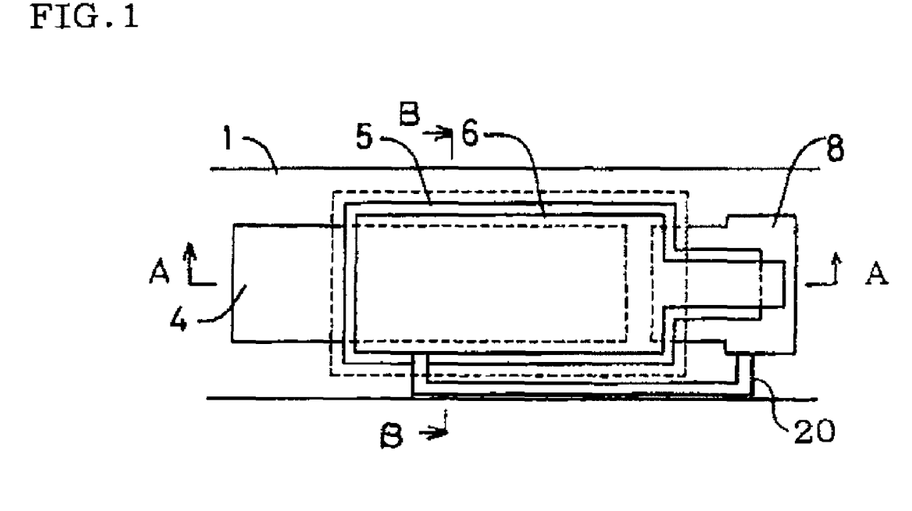
FIG. 1 is a plan view showing an embodiment of a piezoelectric/electrostrictive device of the present invention.
Figure 2:
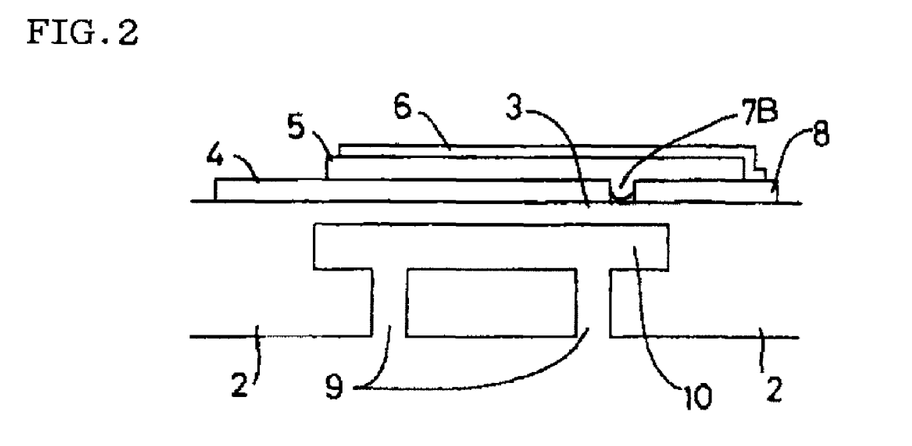
FIG. 2 is a view showing an embodiment of a piezoelectric/electrostrictive device of the present invention and cross-sectional view showing the A-A cross section in FIG. 1.
Figure 3:
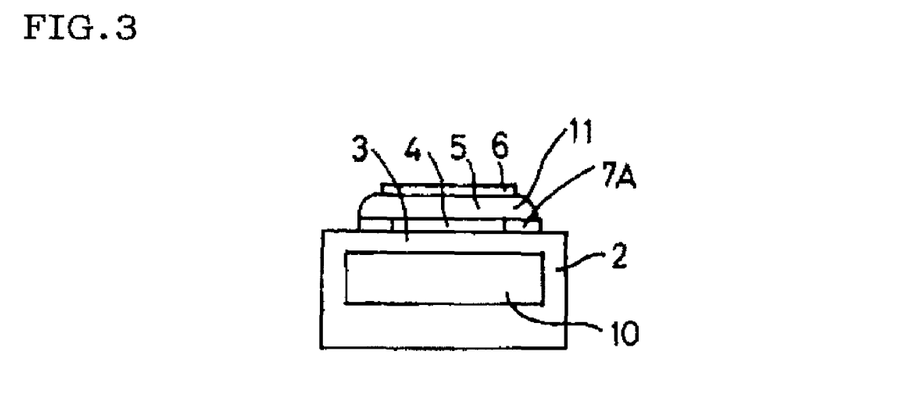
FIG. 3 is a view showing an embodiment of a piezoelectric/electrostrictive device of the present invention and cross-sectional view showing the B-B cross section in FIG. 1.

FIGS. 1, 2, and 3 show a piezoelectric/electrostrictive device for a sensor as an embodiment of a piezoelectric/electrostrictive device of the present invention. In such a piezoelectric/electrostrictive device (film type element), a lower electrode 4, a piezoelectric/electrostrictive film 5, and an upper electrode 6 are stacked in this order on a ceramic substrate 1 (correspond to a substrate formed of ceramic) having a thin diaphragm portion 3 and a thin portion 2 by a general film-forming method to give a unitary structure. An end on the auxiliary electrode 8 side of the lower electrode 4 is formed to have a length up to a position of not extending over the thin diaphragm portion 3. In a position on the same plane as the lower electrode 4 and independent from the lower electrode 4, an auxiliary electrode 8 is continuously formed to have a predetermined length from a thick portion 2 on the opposite side of the lower electrode 4 to the thin diaphragm portion 3 in such a manner that the auxiliary electrode 8 gets under the piezoelectric/electrostrictive film 5.

The piezoelectric/electrostrictive film 5 is formed in such a manner that it extends from the lower electrode 4 to the auxiliary electrode 8, the upper electrode 6 is formed so as to have an electrical conduction to the auxiliary electrode 8, and an incompletely bonded portion 7B is arranged closely only to a thin diaphragm portion 3. Incidentally, a protruding portion 11 is not always necessary, and, when reduction in variance or change in the course of time of an electric constant as element characteristics is required, the lower electrode 4 and the piezoelectric/electrostrictive film 5 may have almost the same size. In addition, a structure where the lower electrode 4 and the auxiliary electrode 8 are formed to be larger than the piezoelectric/electrostrictive film 5 with no incomplete bonding portion 7A can allow a positional deviation and can suitably be used for an application requiring higher durability or the like.

In addition, a connection electrode 20 for electrically connecting the auxiliary electrode 8 with the upper electrode 6 is provided. By this, the upper electrode 6 and the auxiliary electrode 8 are electrically connected with each other via a plurality of routes which are mutually independent (two routes in the embodiment shown in FIGS. 1, 2, and 3). Incidentally, the end of the connection electrode 20 on the upper electrode 6 side may be connected with the upper electrode 6 at any position thereof. However, it is preferable to connect the end at a portion apart from the auxiliary electrode 8 (i.e., a portion where two routes are relatively apart from each other). This is because, in the case that a part of the upper electrode 6 is broken, a possibility of connection through at least one of the two routes being maintained increases.

As a material for the ceramic substrate 1, a material having thermal resistance, chemical stability, and insulation is suitable. This is because there are the cases that a heat treatment is performed when unitarily joining parts corresponding with the piezoelectric/electrostrictive element, i.e., the lower electrode 4, the piezoelectric/electrostrictive film 5, and the upper electrode 6 and that a piezoelectric/electrostrictive device as a sensor senses characteristics of liquid having conductivity or corrosiveness as described later. From such a viewpoint, examples of the usable ceramic include stabilized zirconium oxide, aluminum oxide, magnesium oxide, mullite, aluminum nitride, silicon nitride, glass, and the like. Of these, zirconium oxide can suitably be employed because mechanical strength can be kept high even when a thin diaphragm portion is formed to be thin, and it is excellent in tenacity.

The thin diaphragm portion 3 of the ceramic substrate 1 has a thickness of generally 50 μm or less, preferably 30 μm or less, and more preferably 15 μm or less. As a planar shape of the thin diaphragm portion 3, any shape such as a rectangle, a square, a triangle, an oval, a complete circle or the like can be employed. When a piezoelectric/electrostrictive device is employed as a sensor requiring simplification of an excited resonance mode, a rectangle or a complete circle is selected as necessary.

On such a ceramic substrate 1, the lower electrode 4 and the auxiliary electrode 8 are formed. The lower electrode 4 has a predetermined size equivalent to or smaller than the size of the piezoelectric/electrostrictive film 5 formed on the thin diaphragm portion 3. On the other hand, the auxiliary electrode 8 is formed continuously from the end on the opposite side of the lower electrode 4 of the ceramic substrate 1 to a predetermined position of the thin diaphragm portion 3. The end portions of the lower electrode 4 and the auxiliary electrode 8 on the thick portion 2 are used as lead terminals.

The lower electrode 4 and the auxiliary electrode 8 may be formed of different materials or the same material, and conductive materials having good bondability with both the ceramic substrate 1 and the piezoelectric/electrostrictive film 5 is used. Suitable examples of the electrode materials include materials containing as the main component platinum, palladium, rhodium, silver, or an alloy of these components. In particular, when a heat treatment is conducted for sintering upon forming the piezoelectric/electrostrictive film 5, platinum or an alloy containing platinum as the main component can suitably be employed.

The lower electrode 4 and the auxiliary electrode 8 can be formed by a known film-forming technique. To be concrete, there can suitably be selected a thin-film forming technique such as ion beam, sputtering, vacuum vapor deposition, CVD, ion plating, or plating; or a thick-film forming technique such as screen printing, spraying, dipping, or the like. Of these, sputtering or screen printing are particularly suitably selected.

Figure 4:
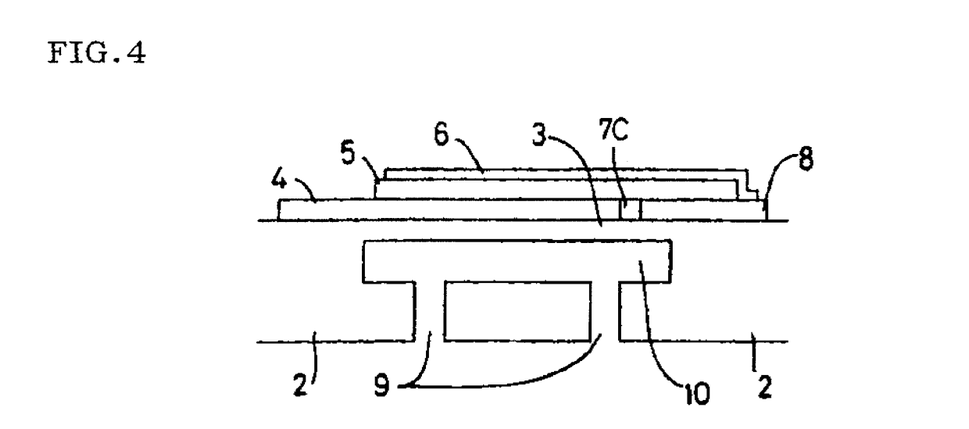
FIG. 4 is an explanatory view showing another embodiment of a piezoelectric/electrostrictive device of the present invention and cross-sectional view showing a cross section corresponding with FIG. 2.

In the case that a bonding layer for bonding the piezoelectric/electrostrictive film 5 and the thin diaphragm portion 3 is provided between the lower electrode 4 and the auxiliary electrode 8, a bonding layer 7C is formed as shown in FIG. 4 at a position of an incomplete bonding portion 7B prior to formation of the piezoelectric/electrostrictive film 5. For the bonding layer 7C formed of an insulator, any organic or inorganic material can be employed as long as it has high adhesion and bondability to both the piezoelectric/electrostrictive film 5 and the ceramic substrate 1. In addition, a thermal expansion coefficient of the material used for the bonding layer 7C preferably has an intermediate value between the thermal expansion coefficient of the material for the ceramic substrate 1 and the thermal expansion coefficient of the material for the piezoelectric/electrostrictive film 5 because bondability having high reliability can be attained. In the case that the piezoelectric/electrostrictive film 5 is subjected to the heat treatment for sintering, glass materials can suitably be used as the material constituting the bonding layer 7C because it has high adhesion and bondability to both the piezoelectric/electrostrictive film 5 and the ceramic substrate 1. Of these, a glass material having the same softening point as the heat treatment temperature of the piezoelectric/electrostrictive film 5 or higher is suitably be used because the piezoelectric/electrostrictive film 5 can be bonded more firmly to the ceramic substrate 1 with inhibiting deformation due to the thermal treatment because of the high softening point.

Further, in the case that the piezoelectric/electrostrictive film 5 is constituted by $(Bi_{0.5}Na_{0.5})TiO_3$ (bismuth sodium titanate) described later or a material containing this compound as the main component, or $(1-x)(Bi_{0.5}Na_{0.5})TiO_3$-$xKNbO_3$ (x is a mole percentage, $0 \leq x \leq 0.06$) or a material containing this component as the main component, the bonding layer 7C constituted by a material containing $(1-x)(Bi_{0.5}Na_{0.5})TiO_3$-$xKNbO_3$ (x is a mole percentage, $0.08 \leq x \leq 0.5$) as the main component is more suitably used because the material shows high adhesion to both the piezoelectric/electrostrictive film 5 and the ceramic substrate 1 and because a bad influence on the piezoelectric/electrostrictive film 5 and the ceramic substrate 1 upon the heat treatment can be suppressed. That is, by employing $(1-x)(Bi_{0.5}Na_{0.5})TiO_3$-$xKNbO_3$ (x is a mole percentage, $0.08 \leq x \leq 0.5$) for the bonding layer 7C, the bonding layer 7C has a component similar to that of the piezoelectric/electrostrictive film 5, and thereby the bonding layer 7C has high adhesion to the piezoelectric/electrostrictive film 5 and less problems due to diffusion of different kinds of elements, which is easily caused in the case of using glass, to enable firm bonding with high reactivity with the ceramic substrate 1. Since $(1-x)(Bi_{0.5}Na_{0.5})TiO_3$-$xKNbO_3$ (x is a mole percentage, $0.08 \leq x \leq 0.5$) hardly shows piezoelectric characteristics, stable element characteristics can be obtained because vibrations, displacement, and stress do not generate with respect to an electric field generating at the lower electrode 4 and the auxiliary electrode 8 upon use.

The bonding layer 7C can be formed by a general thick film-forming technique, and suitably employed is stamping, screen printing, or ink jet in the case that a portion where the bonding layer 7C is formed is about several tens μm to several hundreds μm. In the case that the bonding layer 7C requires a heat treatment, it may be subjected to the thermal treatment before the piezoelectric/electrostrictive film 5 is formed, or it may be subjected to the thermal treatment at the same time after the piezoelectric/electrostrictive film 5 is formed.

The piezoelectric/electrostrictive film 5 is formed to extend over the lower electrode 4, the auxiliary electrode 8, and the bonding layer 7C and has a size covering the lower electrode 4. As the material for the piezoelectric/electrostrictive film 5, any material may be used as long as it shows piezoelectric/electrostrictive effect. Examples of the material include lead-based ceramic piezoelectric/electrostrictive materials such as lead zirconate, lead titanate, lead zirconate titanate and the like; a barium titanate-based ceramic ferroelectric body such as barium titanate, or one containing barium titanate as the main component; polymer piezoelectric body represented by polyvinylidene fluorite, a Bi-based ceramic piezoelectric body represented by $(Bi_{0.5}Na_{0.5})TiO_3$ (bismuth sodium titanate), and bismuth layered ceramic. Needless to say, there may also be employed a mixture of them, a solid solution of them, or a material where an additive is added to them in order to improve the piezoelectric/electrostrictive characteristics. A PZT-based piezoelectric body has high piezoelectric characteristics and is suitably be used as a material for a sensor capable of sensing with high sensitivity. In the present invention, there is more suitably employed a material containing as the main component at least one kind selected from the group consisting lead titanate, lead zirconate, lead magnesium niobate, lead nickel niobate and the like because it has low reactivity with the material constituting the ceramic substrate 1, segregation of the components is hardly caused during the heat treatment, a treatment for maintaining the composition can be performed well, and the aimed composition and crystal structure can easily be obtained.

In the case that platinum or an alloy containing platinum as the main component is used for the lower electrode 4 and the auxiliary electrode 8, $(Bi_{0.5}Na_{0.5})TiO_3$ or a material containing $(Bi_{0.5}Na_{0.5})TiO_3$ as the main component is suitably used because it has high adhesion and less variance in characteristics of the element, and high reliability can be obtained. Of these, $(1-x)(Bi_{0.5}Na_{0.5})TiO_3\text{-}xKNbO_3$ (x is a mole percentage, $0 \leq x \leq 0.06$) or a material containing this component as the main component can more suitably be used because of relatively high piezoelectric characteristics. Though phase transformation temperature of the material depends on the material composition, it has a ferroelectric phase from ordinal temperature to around 100 to 200° C., an antiferroelectric phase from around 100 to 200° C. to around 250 to 320° C., and a paraelectric phase at around 250 to 320° C. or higher.

By such a piezoelectric/electrostrictive material, the piezoelectric/electrostrictive film 5 is formed by a known film-forming method like the lower electrode 4 and the auxiliary electrode 8. In particular, screen printing is suitably employed from the viewpoint of low costs.

The piezoelectric/electrostrictive film 5 formed of the material is subjected to the heat treatment as necessary and unitarily joined with the lower electrode 4, the auxiliary electrode 8, and the bonding layer 7C. In the case that bonding of the piezoelectric/electrostrictive film 4, the lower electrode 5, the auxiliary electrode 8, and the bonding layer 7C is required to be firmer in order to suppress fluctuation in characteristics and increase reliability of the piezoelectric/electrostrictive device, it is preferable to use $(Bi_{0.5}Na_{0.5})TiO_3$ or a material containing this component as the main component, particularly $(1-x)(Bi_{0.5}Na_{0.5})TiO_3\text{-}xKNbO_3$ (x is a mole percentage, $0 \leq x \leq 0.06$) or a material containing the compound as the main component and to subject the material to the thermal treatment at 900° C. to 1400° C., preferably 1000° C. to 1300° C. The case of using a PZT-based material is treated similarly. At this time, it is preferable to perform the heat treatment while the atmosphere is controlled with an evaporation source of the piezoelectric/electrostrictive material lest the piezoelectric/electrostrictive film 5 should be unstable at high temperature.

Further, on the piezoelectric/electrostrictive film 5 formed as described above, the upper electrode 6 is formed continuously from the piezoelectric/electrostrictive film 5 to the auxiliary electrode 8. The upper electrode 6 employs as the material therefor a conductive material having high bondability to the piezoelectric/electrostrictive film 5 and is formed by a film-forming method similar to those for the lower electrode 4 and the auxiliary electrode 8. Further, the upper electrode 6 is subjected to thermal treatment as necessary after the film formation, bonded to the piezoelectric/electrostrictive film 5 and the auxiliary element 8 to have a unitary structure. Such a thermal treatment is not always necessary like the lower electrode 4.

Incidentally, in the case that the lower electrode 4, the bonding layer, the piezoelectric/electrostrictive film 5, and the upper electrode 6 are bonded together by a heat treatment, each may be subjected to a heat treatment independently upon formation, or a heat treatment may be performed simultaneously after they are formed in order. Needless to say, temperature for the heat treatment should properly be selected for good bondability and suppression of deformation due to diffusion of constituents when the thermal treatment is performed. Though a through-hole 9 is formed in a hollow portion 10 in the embodiment shown in FIGS. 1, 2, and 3, there is no limitation on the structure of a portion in contact with fluid in the piezoelectric/electrostrictive device, and any structure such as a simple cavity structure without a lid portion or the like may be employed. Further, there may be employed a structure where the end of the piezoelectric/electrostrictive film 5 on the auxiliary electrode 8 side does not protrude from the thin diaphragm portion 3 in such a manner that the piezoelectric/electrostrictive film 5 does not overlap the thick portion 2.

By applying pulsing voltage a plurality of times to the piezoelectric/electrostrictive device (specifically, the piezoelectric/electrostrictive film 5) for the polarization treatment, polarizability can be enhanced for a short period of time. In this case, pulsing voltage is applied in such a manner that the pulsing voltage increases according to the progress of the number of application times, the polarizability can be enhanced for a shorter period of time. This is presumed to be based on the polarization treatment performed with lightening the stress inside the piezoelectric/electrostrictive film 5.

By subjecting the piezoelectric/electrostrictive film 5 to the polarization treatment after subjecting the piezoelectric/electrostrictive film 5 of the piezoelectric/electrostrictive device (piezoelectric/electrostrictive element) to a heat treatment again after the aforementioned polarization treatment or without performing the aforementioned polarization treatment, followed by being allowed to stand, and the value of an electric constant (e.g., electrostatic capacity (capacitance) and loss coefficient) has converged after the heat treatment (when the value has converged, that is, when the value shows final convergence) predetermined performance in the piezoelectric/electrostrictive film 5 can surely be ensured. This is because, since the piezoelectric/electrostrictive film 5 is subjected to the polarization treatment after the phase transition after the heat treatment of the piezoelectric/electrostrictive film 5 is completed, unnecessary stress does not remain inside the piezoelectric/electrostrictive film 5, and therefore characteristics of the piezoelectric/electrostrictive material do not deteriorate due to the stress. That is, by performing the polarization treatment with a timing determined depending on the value of the electric constant of the piezoelectric/electrostrictive film 5 after the piezoelectric/electrostrictive film 5 is heated and allowed to stand at ordinary temperature, a larger displacement amount and a larger displacement-generating force can be exhibited, and a piezoelectric/electrostrictive device (piezoelectric/electrostrictive element) having high output with respect to a distortion when it is used as a sensor can be obtained.

The aforementioned polarization treatment after the piezoelectric/electrostrictive film 5 is allowed to stand may be performed by applying pulsing voltage only once in the case that the polarization treatment is already performed before the heat treatment, and characteristics of the piezoelectric/electrostrictive device can be stabilized by this treatment.

Figure 8:
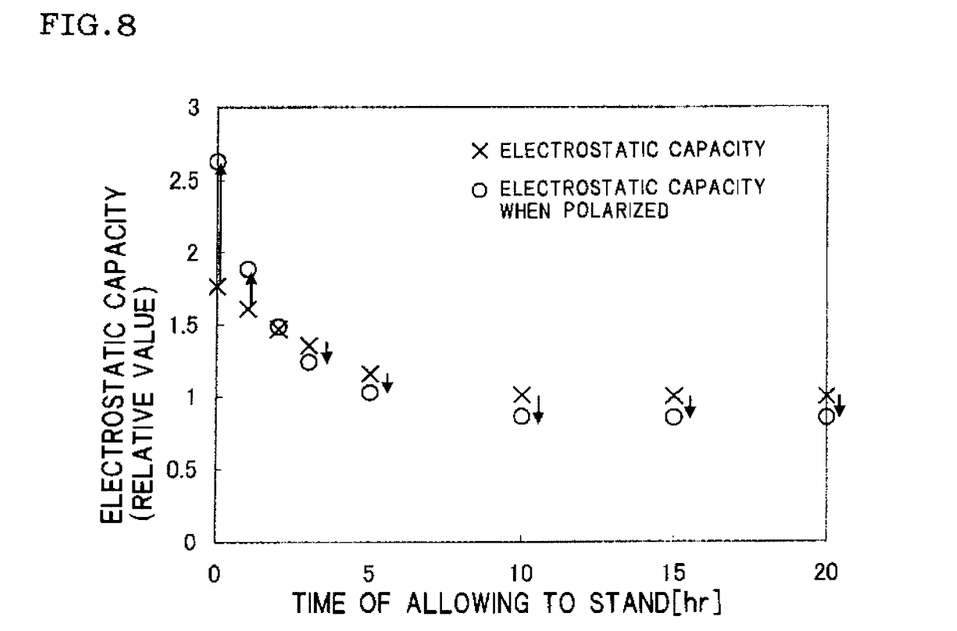
FIG. 8 is a graph showing an embodiment of a method for manufacturing a piezoelectric/electrostrictive device of the present invention showing a relation between the time of allowing to stand the piezoelectric/electrostrictive film (axis of abscissas) after a heat treatment and the electrostatic capacity of the piezoelectric/electrostrictive film (relative value, axis of ordinates) in the case that the electrostatic capacity is employed as an electric constant.

A piezoelectric/electrostrictive device shown in FIGS. 1, 2, and 3 and manufactured by the aforementioned method using a material containing $(Bi_{0.5}Na_{0.5})TiO_3$ as the main component for the piezoelectric/electrostrictive film 5 and stabilized zirconium oxide for the ceramic substrate 1 was subjected to the heating regeneration treatment at 350° C., allowed to stand at ordinary temperature (25° C.) for a fixed time, and subjected to a polarization treatment. These serial steps were repeated with changing the time for allowing to stand, and the electrostatic capacity before and after the polarization treatment was measured by an LCR meter for each time for allowing to stand, and thereby data on the electrostatic capacity values before and after the polarization treatment with respect to the time for allowing to stand were obtained. The results are shown in FIG. 8. FIG. 8 shows a correlation between the time for allowing to stand after the heat treatment was performed to the piezoelectric/electrostrictive film 5 (axis of abscissas) and the electrostatic capacity (relative value, axis of ordinates) in the case of employing electrostatic capacity as the electric constant. In FIG. 8, the mark x shows electrostatic capacity before the polarization treatment, the mark o shows electrostatic capacity after the polarization treatment, and the arrows show directions of change in the electrostatic capacity due to the polarization treatment.

It is understood that, when the time for allowing to stand is 0 hour, the electrostatic capacity of the piezoelectric/electrostrictive film 5 after the polarization treatment is relatively larger than that before the polarization treatment; while, when the time for allowing to stand is 3 hours or more, the electrostatic capacity of the piezoelectric/electrostrictive film 5 after the polarization treatment is relatively smaller than that before the polarization treatment with the time for allowing to stand of 2 hours being the boundary. Since it is assumable that the internal stress of the piezoelectric/electrostrictive film 5 decreases due to convergence of the value by allowing to stand the piezoelectric/electrostrictive film 5 for a predetermined time with the value of the electrostatic capacity changing with respect to time, it is understood that an excellent piezoelectric/electrostrictive device having surely secured predetermined performance in the piezoelectric/electrostrictive film 5 can be obtained by subjecting the piezoelectric/electrostrictive film 5 to the polarization treatment after it was allowed to stand for 3 hours or more.

Incidentally, the thermal expansion rate of the piezoelectric/electrostrictive film 5 formed of the aforementioned material is $13.5\times10^{-6}/°$ C., and the thermal expansion rate of the ceramic substrate 1 is $9.2\times10^{-6}/°$ C. Therefore, thermal stress is generated in the piezoelectric/electrostrictive film 5 due to the difference in the thermal expansion when heat is applied thereto. It is assumable that predetermined performance can easily be secured since the stress due to the heat is released by allowing the piezoelectric/electrostrictive film 5 to stand.

Figure 5:
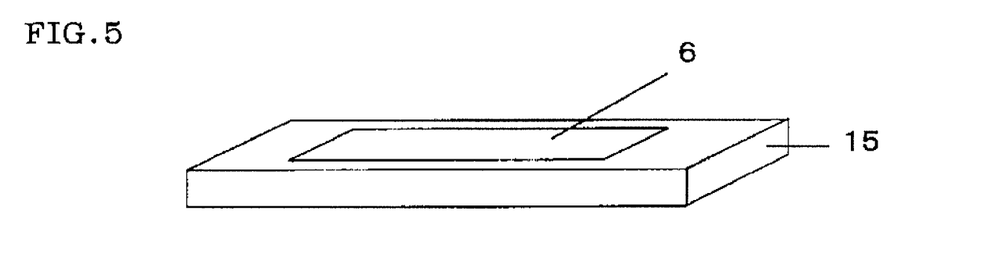
FIG. 5 is a perspective view showing an embodiment of a piezoelectric/electrostrictive element of the present invention.
Figure 6:
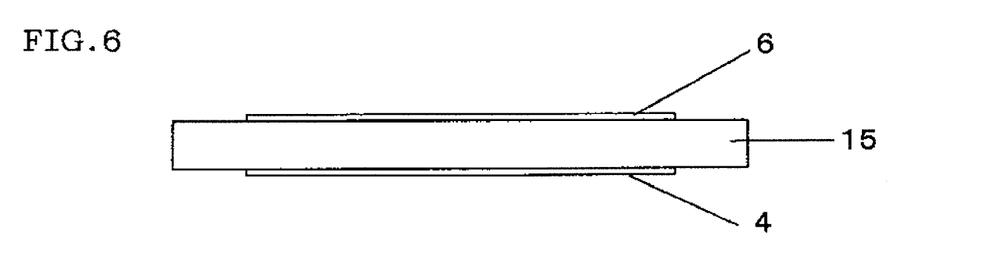
FIG. 6 is a cross-sectional view showing an embodiment of a piezoelectric/electrostrictive element of the present invention.
Figure 7:
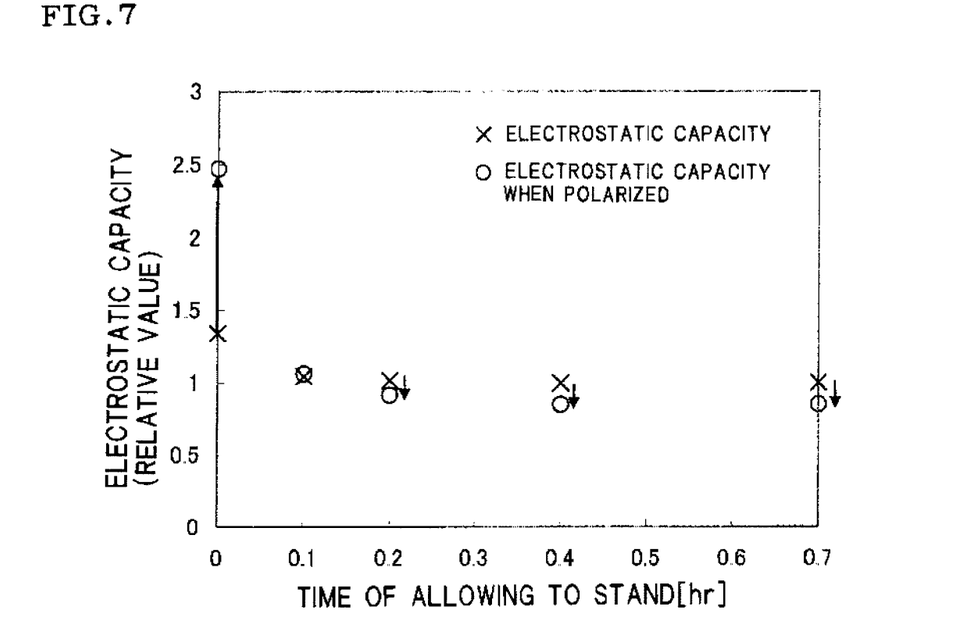
FIG. 7 is a graph showing an embodiment of a method for manufacturing a piezoelectric/electrostrictive element of the present invention showing a relation between the time of allowing to stand the piezoelectric/electrostrictive film (axis of abscissas) after a heat treatment and the electrostatic capacity of the piezoelectric/electrostrictive film (relative value, axis of ordinates) in the case that the electrostatic capacity is employed as an electric constant.

FIG. 7 is a graph showing a correlation between the time for allowing (axis of abscissas) and the electrostatic capacity (relative value, axis of ordinates) after the piezoelectric/electrostrictive film was subjected to the heat treatment in a simplex piezoelectric/electrostrictive element which was not incorporated into the piezoelectric/electrostrictive device. The piezoelectric/electrostrictive element used is shown in FIGS. 5 and 6. Because it is simplex, the piezoelectric/electrostrictive film was made thick to give a rectangular parallelepiped-shaped piezoelectric/electrostrictive film (referred to as piezoelectric/electrostrictive body 15), and the piezoelectric/electrostrictive body 15 was sandwiched by positive and negative electrodes (the upper electrode 6 and the lower electrode 4). Incidentally, in FIG. 5, thickness of the upper electrode 6 is omitted and not expressed.

The piezoelectric/electrostrictive element shown in FIGS. 5 and 6 is manufactured as described below. First, a binder is mixed with a powder containing the piezoelectric/electrostrictive material, $(Bi_{0.5}Na_{0.5})TiO_3$ (bismuth sodium titanate), as the main component, and granulation is performed. Then, the powder is formed into a rectangular parallelepiped using a press machine, and the rectangular parallelepiped is fired. The fired rectangular parallelepiped is cut to have specified dimensions using a wire saw to obtain a piezoelectric/electrostrictive body 15. Then, on the piezoelectric/electrostrictive body 15, the upper electrode 6 and the lower electrode 4 are formed by a sputtering method using an electrode material (Au).

The thus obtained piezoelectric/electrostrictive element (simplex) of the embodiment shown in FIGS. 5 and 6 is subjected to the heating regeneration treatment at 350° C., allowed to stand at room temperature (25° C.) for a certain time, and then subjected to the polarization treatment. The serial steps were repeated with changing the time for allowing to stand, and the electrostatic capacity before and after the polarization treatment was measured by a LCR meter for each time for allowing to stand, and thereby data of values of the electrostatic capacity before and after the polarization treatment with respect to the time for allowing to stand were obtained. FIG. 7 is a graph showing the results. In FIG. 7, the mark x shows electrostatic capacity before the polarization treatment, the mark o shows electrostatic capacity after the polarization treatment, and the arrows show directions of change in the electrostatic capacity due to the polarization treatment.

It is understood that, when the time for allowing to stand is 0 hour, the electrostatic capacity of the piezoelectric/electrostrictive body 15 after the polarization treatment is relatively larger than that before the polarization treatment; while, when the time for allowing to stand is 0.2 hour or more, the electrostatic capacity of the piezoelectric/electrostrictive body 15 after the polarization treatment is relatively smaller than that before the polarization treatment with the time for allowing to stand for 0.1 hour being the boundary. Since it is assumable that the internal stress of the piezoelectric/electrostrictive body 15 decreases due to convergence of the value by allowing to stand the piezoelectric/electrostrictive body 15 for a predetermined time with the value of the electrostatic capacity changing with respect to time, it is understood that an excellent piezoelectric/electrostrictive element having surely secured predetermined performance in the piezoelectric/electrostrictive body 15 can be obtained by subjecting the piezoelectric/electrostrictive body 15 to the polarization treatment after allowing to stand it for 0.2 hour or more.

Incidentally, in a method for manufacturing a piezoelectric/electrostrictive element of the present invention, there is no limitation on a forming method, a cutting method, an electrode-forming method, and a firing method. In addition, the order of these steps can be changed as necessary. For example, a tape-forming method such as doctor blading as the forming method; screen printing or stamping as the electrode-forming method; or knife-cutting or dicer as the cutting method can suitably be employed. In addition, it is also possible to have the cutting step and/or the electrode-forming step before firing.

INDUSTRIAL APPLICABILITY

A method for manufacturing a piezoelectric/electrostrictive element of the present invention can be used as a means for manufacturing a piezoelectric/electrostrictive device such as an actuator utilizing bending displacement and a sensor for measuring sound pressure or fluid viscosity.

The invention claimed is:

1. A method for manufacturing a piezoelectric/electrostrictive element, the method comprising:
    providing a piezoelectric/electrostrictive element having a lower electrode, a piezoelectric/electrostrictive film, and an upper electrode stacked in this order;
    subjecting the lower electrode, the piezoelectric/electrostrictive film and the upper electrode to a heat treatment to form the piezoelectric/electrostrictive element;
    subjecting the piezoelectric/electrostrictive element to a heat regeneration treatment at a temperature at least equal to a phase transition temperature of the piezoelectric/electrostrictive film;
    allowing the piezoelectric/electrostrictive element to stand until a value of an electric constant of the piezoelectric/electrostrictive film after the heat regeneration treatment has converged with a value of the electric constant of the piezoelectric/electrostrictive film prior to the heat regenerating treatment; and
    then subjecting the piezoelectric/electrostrictive film to a polarization treatment, wherein allowing the piezoelectric/electrostrictive element to stand until the value of the electric constant converges is performed after the heat regeneration treatment and before the polarization treatment.

2. A method for manufacturing a piezoelectric/electrostrictive element according to claim 1, wherein a temperature when the piezoelectric/electrostrictive film is allowed to stand is the same as the phase transformation temperature of the piezoelectric/electrostrictive film or lower.

3. A method for manufacturing a piezoelectric/electrostrictive element according to claim 1, wherein the polarization treatment is conducted by applying pulsing voltage to the piezoelectric/electrostrictive film at least once.

4. A method for manufacturing a piezoelectric/electrostrictive element according to claim 1, wherein the electric constant is an electrostatic capacity or a loss coefficient.

5. The method of claim 1 wherein the electric constant of the piezoelectric/electrostrictive film is selected from the group consisting of resistance, reactance, conductance, susceptance and inductance.

* * * * *